United States Patent
Bellido-Gonzalez

(10) Patent No.: US 6,551,718 B2
(45) Date of Patent: Apr. 22, 2003

(54) LOW FRICTION COATING

(75) Inventor: Victor Bellido-Gonzalez, Liverpool (GB)

(73) Assignee: Gencoa Ltd. (GB)

(*) Notice: Subject to any disclaimer, the term of this patent is extended or adjusted under 35 U.S.C. 154(b) by 0 days.

(21) Appl. No.: 09/319,826
(22) PCT Filed: Dec. 10, 1997
(86) PCT No.: PCT/GB97/03406
§ 371 (c)(1), (2), (4) Date: Aug. 27, 1999
(87) PCT Pub. No.: WO98/26106
PCT Pub. Date: Jun. 18, 1998

(65) Prior Publication Data
US 2002/0182447 A1 Dec. 5, 2002

(30) Foreign Application Priority Data
Dec. 13, 1996 (GB) .............................. 9625916

(51) Int. Cl.$^7$ .............................. B32B 15/04
(52) U.S. Cl. ............ 428/469; 428/457; 501/151; 501/154; 106/286.2; 106/286.3; 106/286.4; 106/287.1; 106/287.18; 106/287.19; 427/452; 427/455; 427/527; 427/569; 427/578; 427/255.31; 427/255.32; 427/255.33; 427/255.34; 427/255.35; 427/255.36; 427/294
(58) Field of Search ............... 428/457, 469; 501/151, 154; 384/907.1, 913; 427/452, 456, 255.31–255.36, 523, 527, 569, 578, 294; 106/287.19, 287.18, 287.1, 286.1–286.4

(56) References Cited

U.S. PATENT DOCUMENTS

| 4,343,881 | A | * | 8/1982 | Sher et al. ................ 430/57 |
| 5,037,516 | A | | 8/1991 | Buck ................ 204/192.15 |
| 5,268,206 | A | * | 12/1993 | Komatsu et al. ............ 427/548 |
| 5,370,778 | A | * | 12/1994 | Koo et al. ............ 204/192.15 |
| 5,527,594 | A | * | 6/1996 | Kinoshita et al. ........... 428/212 |
| 5,900,318 | A | * | 5/1999 | Yanagisawa ................ 428/422 |
| 6,015,597 | A | * | 1/2000 | David ........................ 427/577 |
| 6,086,986 | A | * | 7/2000 | Suzuki et al. ............... 428/328 |

OTHER PUBLICATIONS

Kraut et al., "Low friction composite coating of CrxSiy/MoS2 on steel". Surface and Coatings Technology, 60 (1993)515–520, no month.*

Stupp, "Synergistic Effects of metals Co–Sputtered with $MoS_2$," *Thin Solid Films*, 84 (1981) 257–266, no month.

Zabinski et al., "Friction properties of $WS_2$/graphite flouride thin films grown by pulsed laser deposition," *Surface and Coatings Technology*, 76–77 (1995) 400–406, no month.

(List continued on next page.)

Primary Examiner—Deborah Jones
Assistant Examiner—Wendy Boss
(74) Attorney, Agent, or Firm—Testa, Hurwitz, Thibeault, LLP

(57) ABSTRACT

Disclosed is a metal sulphide coating composition of the formula $M_XSi_VR_YS_ZF_W$ where M is one or more metals selected from: Mo, Ti, W, Nb, Ta, Zr, and Hf; Si is silicon; R is one or more elements selected from: C, B, Al, V, Cr, Fe, Co, Ni, Sm, Au, Cu, Zn, Sn, Pb, N, H, and O; S is sulphur; F is fluorine; X is 0.2 to 1.5; V is 0.02 to 3; Y is 0 to 4; Z is 0.2 to 6; and W is 0.01 to 6, and in which X, Y, Z, V, and W are given in amounts by atomic ratio. The compositions show good non-stick properties, low hydrophilia, and high stability.

25 Claims, 8 Drawing Sheets

OTHER PUBLICATIONS

Rechberger et al., "High performance cutting tools with a solid lubricant physically vapour–deposited coating," *Surface and Coatings Technology*, 62 (1993) 393–398, no month.

Hilton, "Fracture in $MoS_2$ solid lubricant films," *Surface and Coatings Technology*, 68/69 (1994) 407–415, no month.

Jayaram et al., "Ultrahigh vacuum high resolution transmission electron microscopy of sputter–deposited $MoS_2$ thin films," *Surface and Coatings Technology*, 68/69 (1994) 439–445, no month.

Przybyszewski et al., "Friction and Contact Resistance During Sliding in Vacuum of Some Low–Resistivity Metals Lubricated with Sputtered Molybdenum Disulfide Films," *National Aeronautics and Space Administration*, NASA TN D–5349, 21 pgs.

Hopple et al., "Development, testing and characterization of $MoS_2$ thin film bearings," *Surface and Coatings Technology*, 68/69 (1994) 398–406, no month.

Copy of European Patent Office Standard Search Report for RS 99261.

Zabinski et al., "Friction properties of WS/sub 2//graphite flouride thin films grown by pulsed laser deposition," $22^{nd}$ International Conference on Metallurgical Coating and Thin Films, San Diego, CA, 24–28, Apr. 1995, vol. 77, No. 1–3, ISSN 0257–8972, *Surface and Coatings Technology*, Dec. 1995, pgs. 400–406.

Patent Abstracts of Japan, vol. 015, No. 436 (C–0882), Nov. 7, 1991, JP 03183775 A (Sumitomo Electric Ind Ltd), Aug. 9, 1991.

Database WPI, Section Ch, Week 7908, Derwent Publications Ltd., London, GB, Class E36, AN 79–153228, XP002037695, & SU 601306 A (Bearings Ind Res), Mar. 3, 1978.

Hidoemi Ohnishi et al., Blue–Green Color TFEL Device with Sputtered SRS:CE Thin Films, *Proceedings of the SID.*, vol. 31, No. 1, Jan. 1, 1990, pp. 31–36, XP000115906, see p. 2.

* cited by examiner

LOW FRICTION COATING

This application is a 35 U.S.C. §371 filing of PCT/GB97/03406 filed on Dec. 10, 1997 which claims priority under 35 U.S.C. §119 to U.K. Patent Application No. 9625916.3, filed Dec. 13, 1996.

TECHNICAL FIELD

The present invention relates to a low friction coating and to the deposition of low friction coatings by vacuum ion and plasma techniques. The coatings have non-stick properties, low hydrophilia and high stability.

BACKGROUND ART

The disulphides of elements such as Mo and W are known to have very low friction properties due to their unique chemical bonding and structure. $MoS_2$ and $WS_2$ coatings are currently being deposited by vacuum ion and plasma techniques such as magnetron sputtering (MS), plasma assisted chemical vapour deposition (PACVD) and ion beam assisted deposition (IBAD). $MoS_2$ and $WS_2$ coatings have been used in tribological applications as a solid lubricant in aerospace products [M. R. HILTON, P. D. FLEISCHAUER, Surface and Coating Technology, 68/69 (1994) 398; J. S. PRZYBYSZEWSKI, T. SPALVINS, Nasa T N D-5349, July 1969] and other engineering fields such as cutting applications [J. RECHBERGER, R. DUBACH, Surface and Coating Technology, 60 (1993) 393].

The deposition process has always been subject of poor reproducibility. Different techniques have been applied in order to enhance the reproducibility of coating properties, among them the inclusion of other elements in the structure [M. R. HILTON, Surface and Coating technology, 68/69 (1994) 407; B. S. STUPP, thin Solid Films, 84 (1981) 257]. In certain cases the induction of other elements enhanced the coating properties.

General problems inherent to these family of coatings are their thermal and atmospheric instability. The coatings react with water vapour and oxygen transforming the sulphide into an oxide with very different tribological properties. In addition to these problems the maximum useful thickness for the coating has been always under 2 μm. Thicker coatings tend to suffer severe cracking under working pressure conditions.

Tungsten disulphide films have had their tribological properties improved by incorporating $CF_x$ into a mixture of tungsten and sulphur by pulse laser deposition [Surface and Coatings Technology Col 76–77, 1995 400–406].

Similarly, fluorinated graphite containing 10–40% F has been added in mixtures to $MoS_2$ to improve wear resistance [SU 601306].

However there remains a need for coatings with improved properties which overcome the limitations of present compositions.

DISCLOSURE OF THE INVENTION

According to the present invention there is provided a metal sulphide coating composition characterised in that the composition further comprises silicon and fluorine.

According to a further aspect of the present invention there is provided a method of depositing a low friction metal sulphide coating onto a substrate by a vacuum ion or plasma technique characterised in that silicon and fluorine or precursors thereof are introduced into the deposition unit.

According to yet a further aspect of the present invention there is provided a product coated with a metal sulphide coating composition of the present invention or a product produced by a method of the invention.

Preferably the deposition of coatings is by vacuum ion or plasma techniques such as MS, PACVD, IBAD, electron cyclotron resonance (ECR), arc evaporation (AE), electron beam evaporation (EBE), laser ablation (LA), ion implantation (II), or combinations of these techniques.

More particularly the coatings comprises
  (a) one or more of the following elements: Mo, W, Nb, Ta, Ti, Zr, Hf
  (b) sulphur
  (c) fluorine,
  (d) silicon
and optionally
  (e) one or more of the following elements: C, B, Al, V, Cr, Fe, Co, Ni, Sm, Au, Cu, Zn, Sn, Pb, N, H, O In one embodiment the invention relates to the deposition of a film in which at least one volume, no matter its size, comprises a chemical composition, as either a single or a plurality of phases, of the following formula:

$$M_xR_yS_zSi_vF_w$$

where
  M represents one or several elements as stated in (a)
  S represents the sulphur element;
  Si represents the silicon element;
  F represents the fluorine element;
  and R represents one or more of the elements described in (e).

The values of x, y, z, v and w are within the ranges (by atomic ratio) of:
  x=0.2 to 1.5
  y=0.01 to 4, or y=0 to 4
  z=0.2 to 6
  v=0.02 to 3
  w=0.01 to 6.

Examples of chemical compositions for coatings described by this invention include:

| | | |
|---|---|---|
| $Mo_{1.0}Si_{0.5}S_{2.0}F_{2.0}$ | $Mo_{1.0}B_{0.05}Si_{0.5}S_{2.2}F_{2.0}$ | $W_{0.8}Si_{1.0}B_{0.5}S_{2.0}F_{2.0}$ |
| $Mo_{1.0}Zr_{0.1}Si_{0.5}S_{2.2}F_{2.5}$ | $Mo_{0.2}W_{0.8}Ta_{0.4}B_{0.6}Si_{0.5}S_{2.5}F_3$ | |
| $W_{0.8}Al_{0.1}Cu_{0.1}C_{1.0}B_{.0.5}Si_{0.6}S_{2.0}F_{3.1}$ | | |

In addition the process could be carried out in different vacuum conditions of gases and pressure. Noble gases (He, Ar, Kr, Xe, Rn) or reactive gases (e.g., $H_2$, $O_2$, $N_2$, $SF_6$, $Si_2F_6$) or a mixture of them could be used during the deposition process. The process could also be carried out in ultra-high vacuum, without the assistance of any or very limited gas or vapour sources. The metal elements cited in (a) could have been introduced by different means such as thermal evaporation, arc evaporation, electron beam evaporation, laser ablation, magnetron sputtering, plasma assisted chemical vapour deposition, ion beam assisted deposition, ion implantation, which could use different sources for the elements such as pure metal target (e.g., Mo, W, Nb, Ta, Zr, Hf, Si), alloys (e.g., Mo/W, Mo/Ti/Zr, Mo/Ti, Zr/Ti) and compounds either solid (e.g. $MoS_2$, $WS_2$, $Mo_2C$, $WSi_2$, WC—Co, WC—Ni), liquid (e.g. $WF_6$, $MoF_6$) or gas (e.g. $W(CO)_6$) or any combination of them.

The sulphur could be introduced by the same or different means as stated for the element of section (a), which could use different sources such as pure sulphur (e.g. $S_8$), metal sulphide (e.g. $MoS_2$, $WS_2$, MoWS) or other sulphur compounds (e.g. $SF_6$) or any combination of them.

The fluorine could be introduced by different means using different precursors such as $F_2$, $SF_6$, $C_2F_4$, $CF_4$, $C_2F_6$, $WF_6$, $MoF_6$, $Si_2F_6$, $BF_3$, $NF_3$, or any combination of them.

The silicon could be introduced as a pure element or as a compound, for example, $Si_2F_6$, $Si_3N_4$, SiC or any combination of them.

Elements cited in (e) could be introduced by similar means as (a), (b),(c) and from appropriated sources (e.g. C from C targets or from $C_2H_2$, $C_2F_4$ gas, N from $N_2$ or $NF_3$) or any combination of them.

All the elements present within the coatings described in this invention could be incorporated within the coatings in an homogeneous or inhomogeneous way. The coating described in this invention could be a part or the whole of the total deposited film. The composition of the coating could be homogeneous all the way from the surface to the interface coating-substrate. The coating could be deposited on to other layers deposited by same, similar or different means and same, similar or different chemical composition and/or structure. The coating could vary its composition from the surface towards the interface. The coating could be a partial or total periodic repetition of different layers. The coating could be made of different layers without periodic repetitions. The coating could also be subjected to further vacuum and non-vacuum treatments which could imply changes in its original deposited chemical composition and/or structure (e.g. thermal treatment, chemical or electrochemical treatments, radiation or ablation treatments). These treatments could be also included as a part of the general deposition process.

The coating could be produced on one or several in-line deposition units or on one or several isolated deposition units.

The deposition unit could comprise one or a plurality of coating means and/or sources. Samples to be coated could be static or dynamically moved in the deposition unit.

The coatings described by the present invention have a low friction coefficient.

The coatings described by the present invention have lower hydrophilia than the standard metal disulphide coatings produced previously.

The coatings described by the present invention have good thermal and atmospheric stability which are improved compared to other disulphide coatings.

The coatings described by the present invention have non-sticky properties.

The coating described by the present invention have good tribological properties.

The coatings described by the present invention do not suffer severe cracking during working pressure conditions improving the actual limits of the actual disulphide coatings.

All these properties make possible the use of the coating described by this invention in the following applications:

Optic and magnetic recorder media.

Aircraft and spacecraft bearings.

Ball bearings, ball screw, gears, cam shafts, valves, fuel injectors, oil and combustion pumps, cylinders and piston rings, as an example in the automobile and other motor industries.

Cutting and forming tools such as drills, end mills, inserts, saws and other tools used in the machining of aluminium, aluminium alloys, copper and copper alloys, inserts, precious metals (e.g. gold, silver, osmium, iridium, platinum, ruthenium, rhodium and palladium), steel, stainless steel, carbon fibres, glass fibres, ceramics, metal matrix composites, organic matrix composites, wood, cardboard, plastics and polymers (e.g. plastic packing) or combinations of such materials such as cardboard plus polymer (e.g. tetrabrick packing), aluminium plus polymer (e.g. drink cans), steel plus polymer (e.g. food tins).

Stamping, punching and conforming operations in materials as described in the previous group.

Coating of mould components such as the mould, injectors, nozzles and valves as an example to enhance demoulding and wear protection.

Operations in textiles and paper industry related to guiding, sliding, machining, cutting, stamping, printing, improving the quality and wear resistance of the tools and elements.

The invention will be further described by way of example only with reference to the following figures in which:

BRIEF DESCRIPTION OF THE DRAWINGS

Referring to FIG. 1, a deposition unit includes a vacuum chamber 1, which is vacuumed by means of a pumping system 2. The different elements referred within this invention can be introduced separately or by the same means or channels. In general a single or multiplicity of means 3 could incorporate the elements described in (a) on their own or accompanied by other elements. A single or multiplicity of means 4 could incorporate the sulphur on its own or accompanied by other elements. A single or multiplicity of means 5 could introduce the fluorine on its own or accompanied by other elements. In general a single or multiplicity of means 6 could incorporate silicon on its own or accompanied by other elements. Any other optional elements could be incorporated in like manner. A single or multiplicity of means 7 could introduce one or more noble gases on their own or accompanied by other gases or vapours phases. In the system described by this invention the samples due to be coated 8 are generally situated in a sample holder 9. One or several lines, areas and volumes of energization 10 are normally present within the system. The different elements interact in those lines, areas or volumes producing the final coating on to the samples and other components surfaces. The energization 10 could be plasmas generated by different means, particle accelerators, temperature heaters, radiation waves or glow discharges processes. The samples are normally biased by single or different excitation sources 11 in order to control properties of the deposited films.

Referring to FIG. 2, in that in-line system samples 8 are transported in their holder 9 in the direction from 12 to 13. Three chambers 15, 1 and 16 are represented. The chambers are vacuum isolated by gates 14. Each of the chambers is vacuumed by individual pumping systems 2. In chamber 15 three coating units 20 produce a surface treatment prior to the main deposition. This surface treatment could include etching and/or deposition of one or several interlayers. Coating units 20 normally are comprised of a main body 18 and a target material 19. One of the most common coating units 20 are the magnetrons, where 18 is the magnetron body and 19 the so called target. Inert gases are introduced through 7, which could also carry reactive gases. The chamber 1 is responsible for the deposition of a coating of the present invention. In the figure three magnetrons are represented. The magnetrons comprises magnetron body 21 and target material 22. The target material could be for example $MoS_2$. Lines 4, 5 and 6 could inject gases such as $SF_6$, $C_2F_4$ and $Si_2F_6$. Line 7 could introduce inert gases such as Ar. Chamber 16 represent a post-deposition treatment where a radiant source 23 irradiates the samples 8 producing a transformation in the deposited coating.

Referring to FIG. 3, the deposition chamber 1 is vacuumed by means of a pumping system 2. Samples 8 are situated on to the sample holder 9. Sample holder 9 is connected to a high frequency power supply 24, plasma discharge is generated between the sample holder 9 and an anode 25 which is earthed 26. The reactants are introduced into the chamber through 3, 4, 5, 6 and 7.

FIG. 4, is a top view of a deposition chamber 1 which comprises three magnetrons 20. The samples are situated on a sample holder 9 which has two rotation axis 27 and 28 so that the samples could have an uniform coating by rotating in front of all three magnetrons 20.

FIG. 5, represents a chamber 1 which comprises one magnetron 20 and one electron cyclotron resonance (ECR) unit 29. Highly ionised species create a plasma 10 surrounding the samples 8. The samples are situated on to a holder 9 which rotates 27 allowing higher deposition homogeneity.

FIG. 6, represents a chamber 1 which comprises magnetron units 20 and an ion implantation (II) unit 30. A selected group of ions can be accelerated by using a suitable magnetic arrangement 31. The growing of the film is mainly performed by the magnetrons 20. A plasma 10 surrounds the samples 8 which are supported by a rotating 27 holder 9. The II unit accelerates the ions up to such energy that they could penetrate into the growing film. This input of energy and new elements is used to control properties such as composition and structure within the final deposited film.

FIG. 7, is a graph showing the relative concentration, in arbitrary units (a.u.), for different elements in a graded coating according to the present invention.

FIG. 8, represents a cross section of a multilayered coating according to the present invention. The substrate 32 has been coated first with one interlayer 33 which provides good adhesion between the multilayer and the substrate. The multilayer is composed of alternative layers 34 and 35. Layers 34 could of any composition and structure. Layers 35 have any composition defined by $M_xSi_vR_yS_sF_w$ as disclosed in the present invention. A final layer 36 corresponds to a post-treatment which could provide a better aesthetic appeal to the final coating, for example, a gold plating.

Figure 1:
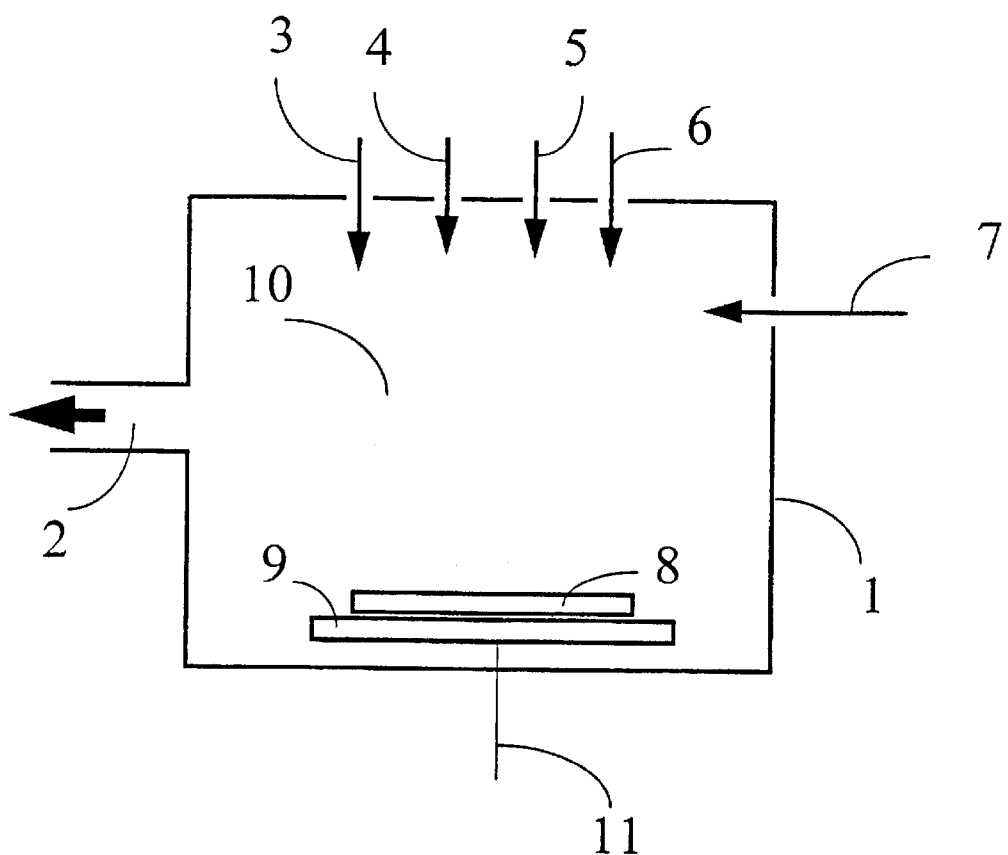
FIG. 1 shows a general deposition unit which produces the coating according to the present invention.
Figure 2:
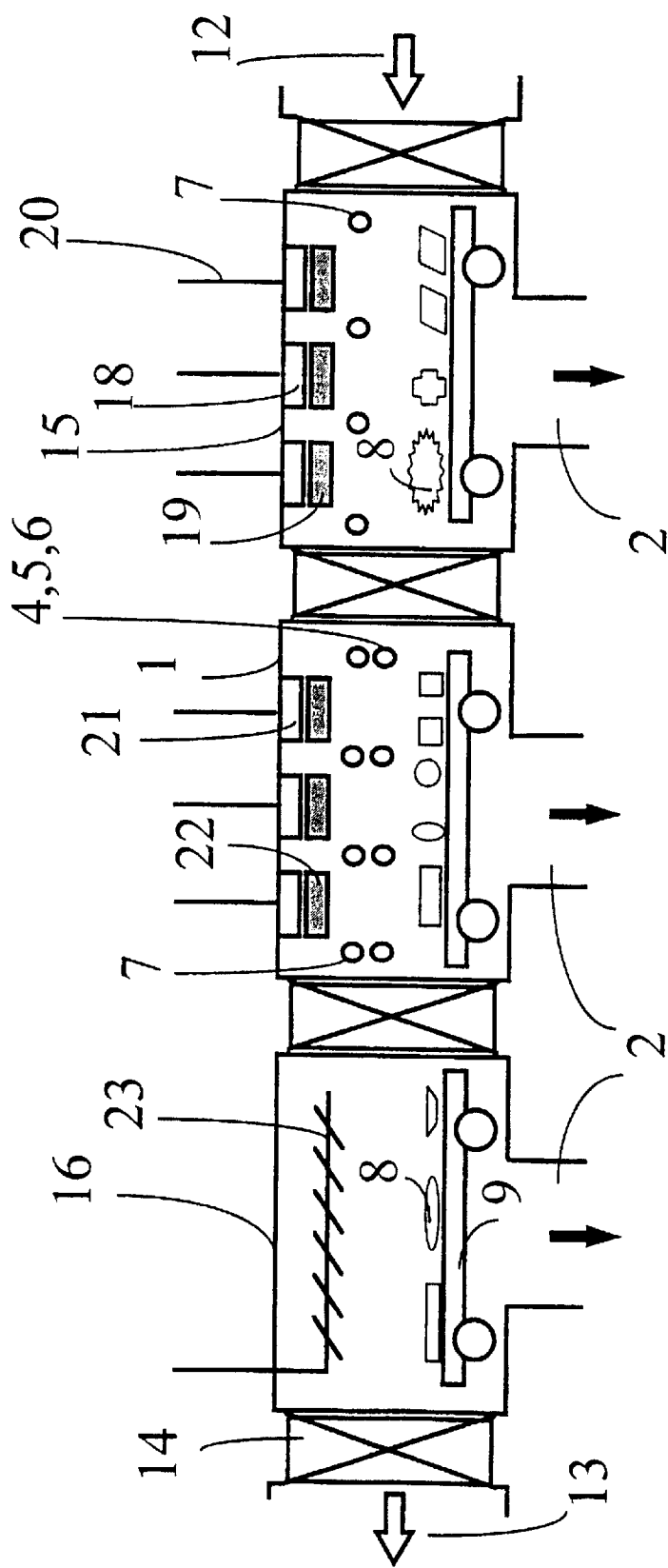
FIG. 2 Illustrates an example of in-line deposition unit producing a coating according to the present invention.
Figure 3:
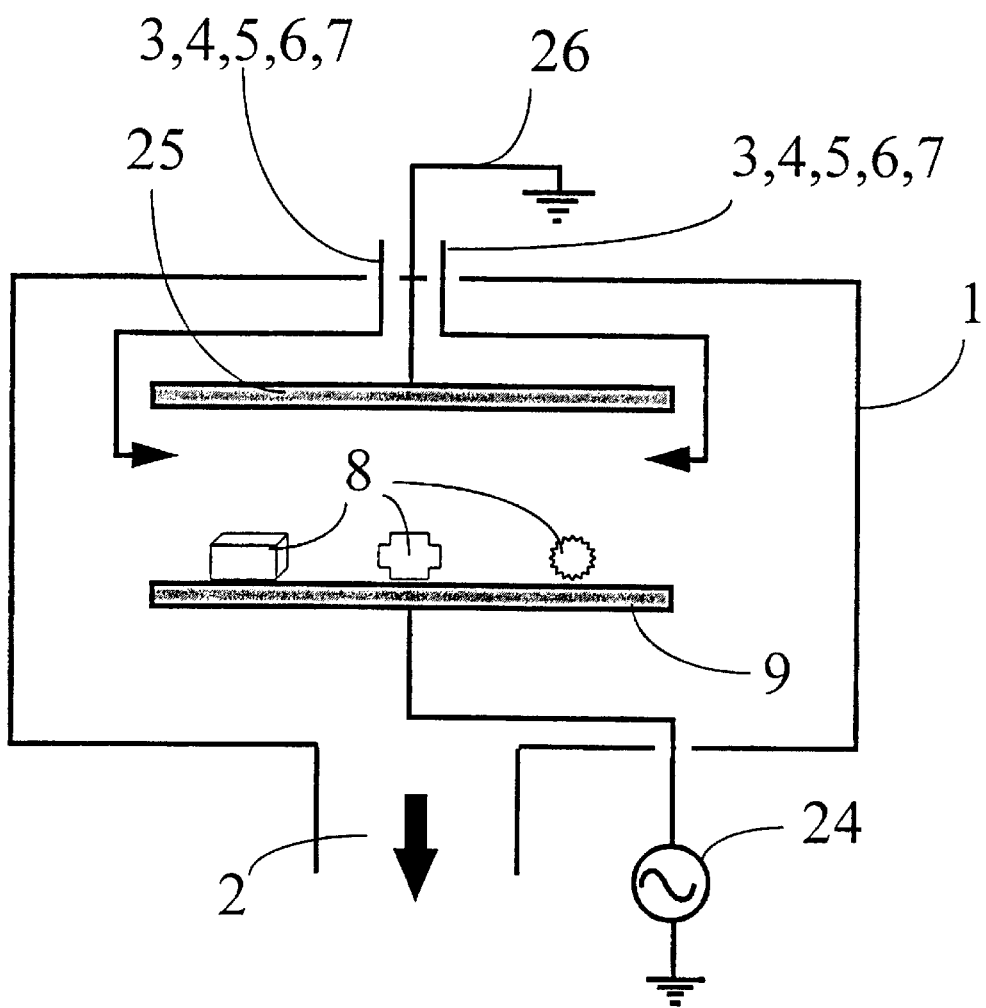
FIG. 3 shows an example of a PACVD deposition unit according to the present invention where the samples are stationary.
Figure 4:
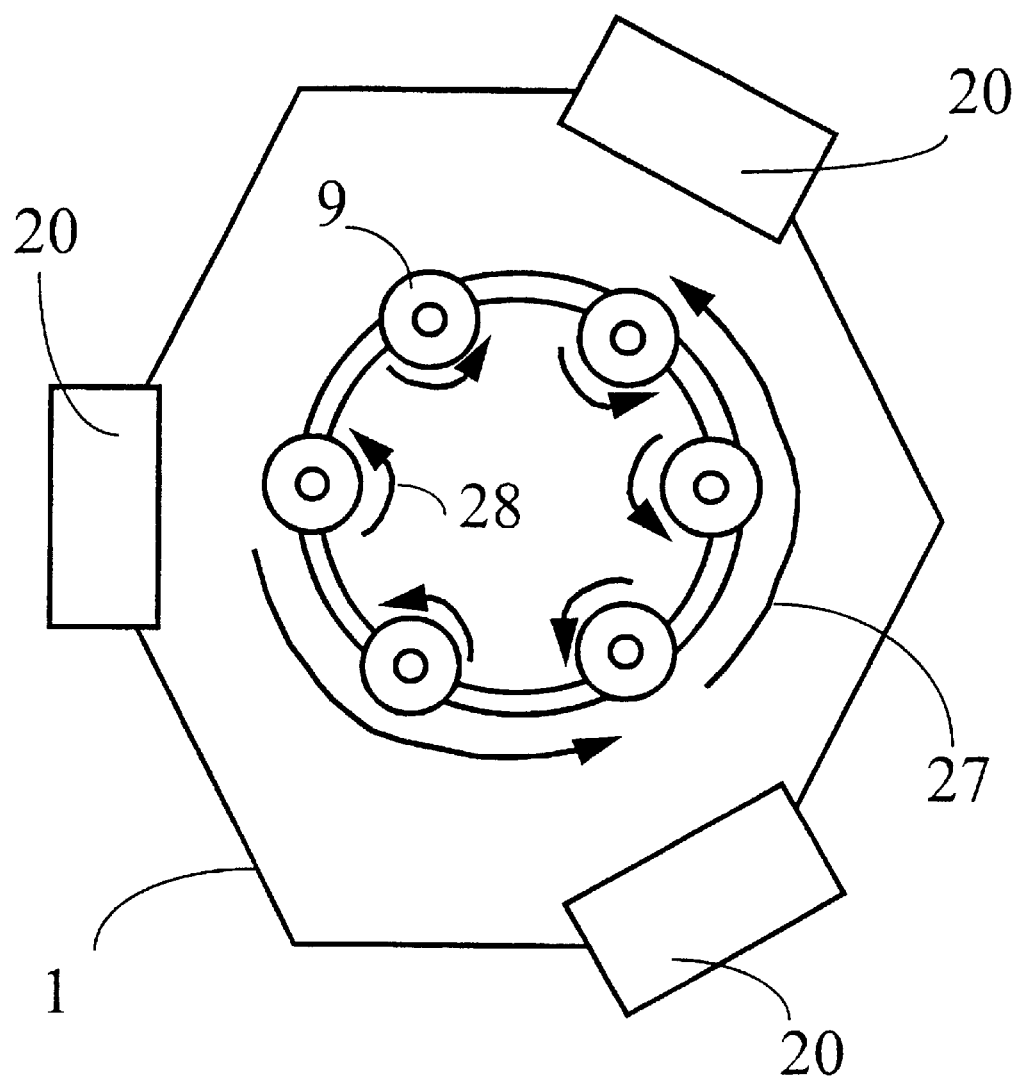
FIG. 4 shows an example of a deposition unit based on MS where the samples rotates in front of the magnetrons producing a coating deposition according to the present invention.
Figure 5:
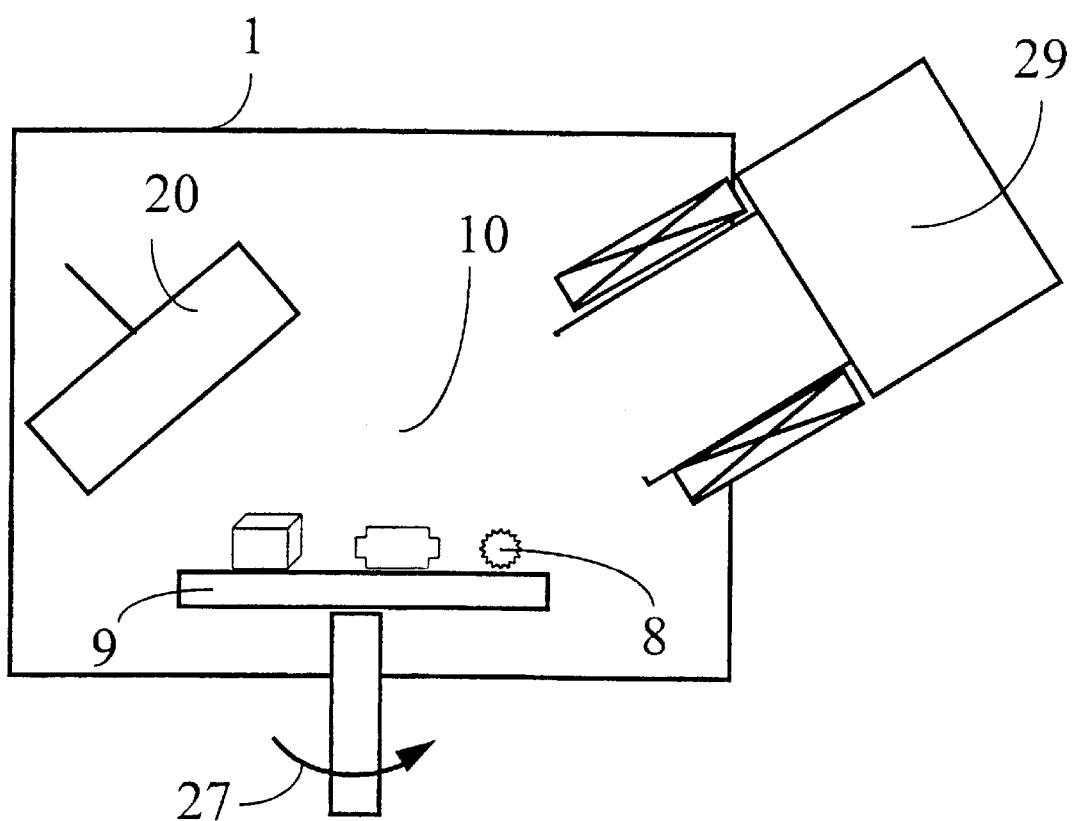
FIG. 5 shows an example of a deposition unit based on a MS and an ECR sources producing a coating deposition according to the present invention.
Figure 6:
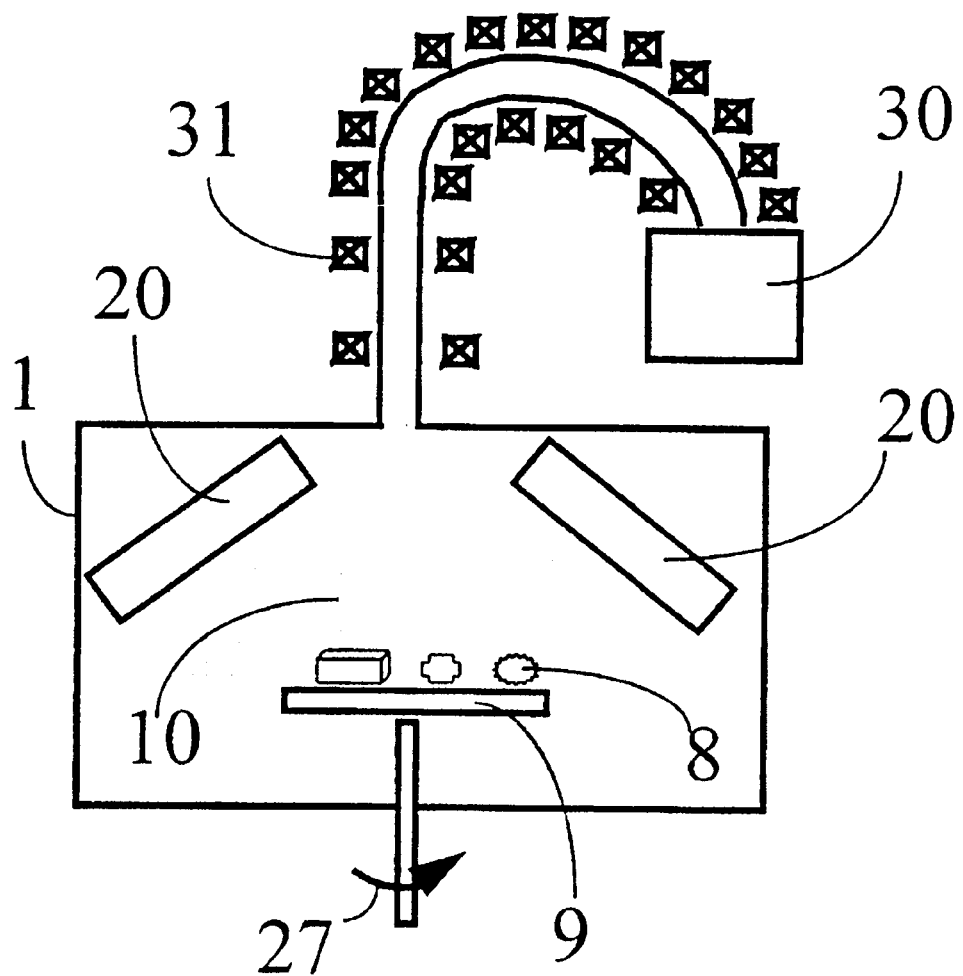
FIG. 6 shows an example of ion implantation (II) and MS producing a coating deposition according to the present invention.
Figure 7:
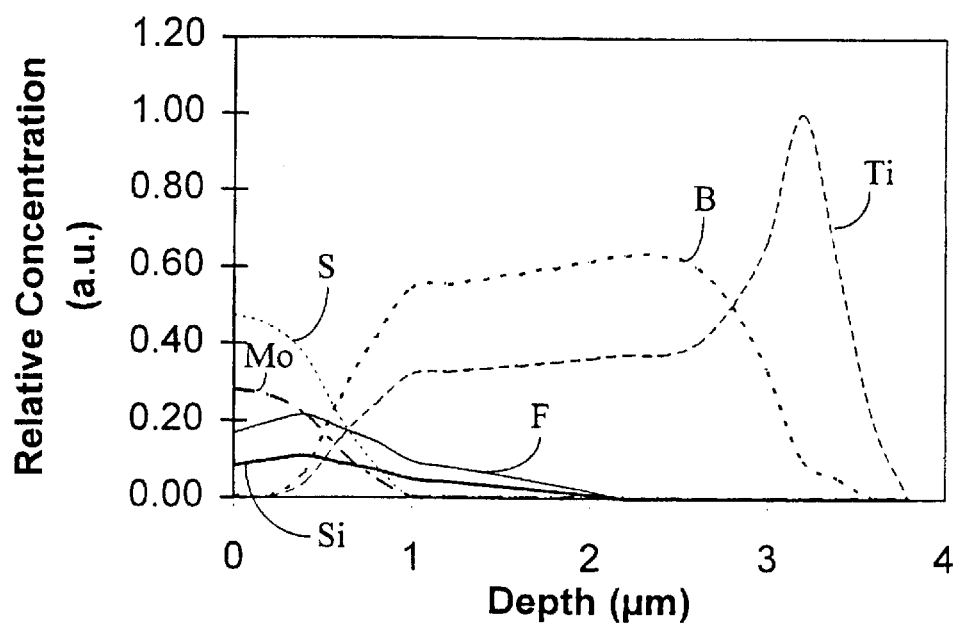
FIG. 7 shows an example of a graded coating composition according to the present invention.
Figure 8:
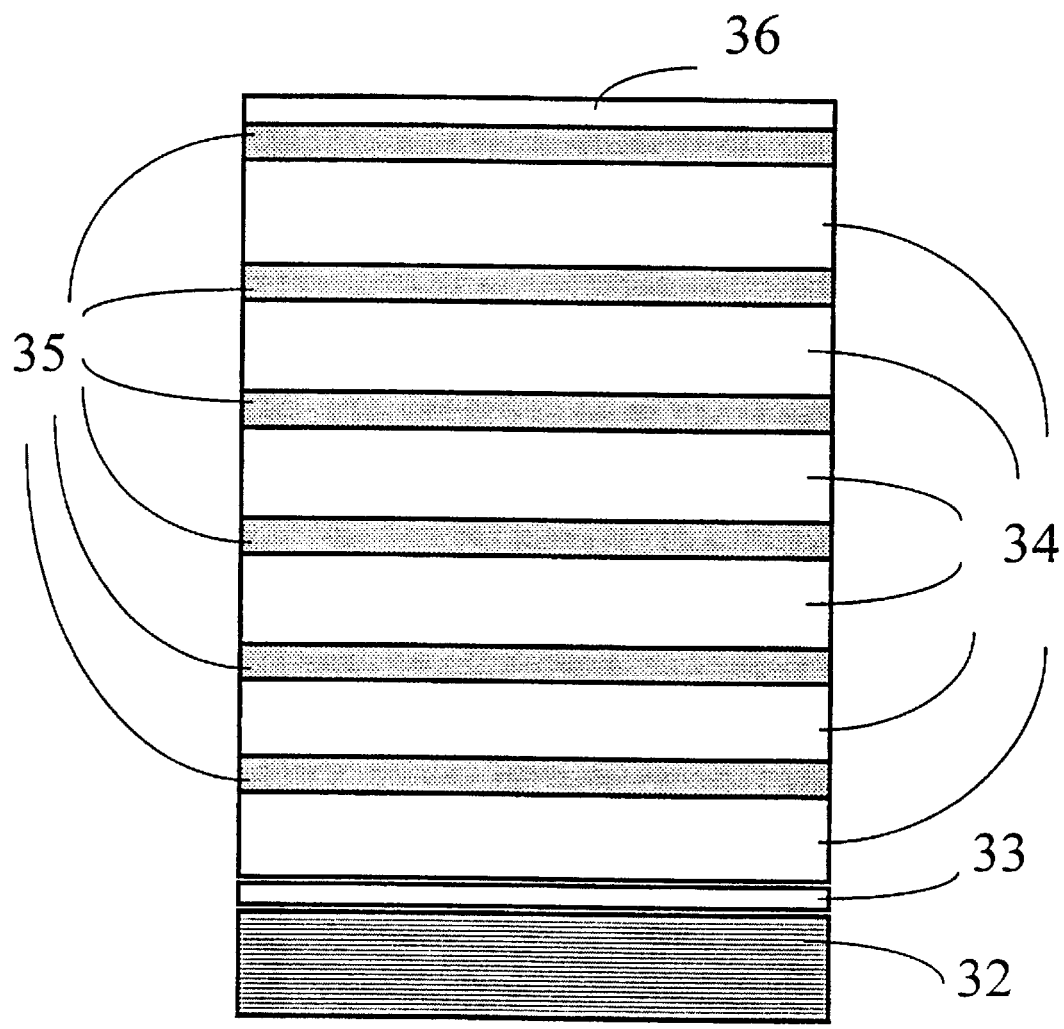
FIG. 8 shows an example of a multilayered coating with a coating post-treatment according to the present invention. (coating+gold).

What is claimed is:

1. A coating composition, comprising: a metal sulphide, silicon and fluorine wherein the metal is selected from the group consisting of Nb, Zr, Hf, and combinations.

2. The coating composition of claim 1 further comprising an element selected from the group consisting of C, B, Al, V, Cr, Fe, Co, Ni, Sm, Au, Cu, Zn, Sn, Pb, N, H, O, and combinations thereof.

3. A metal sulphide coating composition, comprising $$M_xSi_vR_yS_zF_w$$

wherein M is a metal selected from the group consisting of Mo, Ti, W, Nb, Ta, Zr, Hf and mixtures thereof Si is silicon;

R is selected from the group consisting of C, B, Al, V, Cr, Fe, Go, Ni, Sm, Au, Cu, Zn, Sn, Pb, N, H, O and mixtures thereof S is sulphur;

F is fluorine;

x is 0.2 to 1.5;

v is 0.02 to 3;

y is 0 to 4;

z is 0.2 to 6; and w is 0.01 to 6, wherein x, y, z, v and w are given in amounts by atomic ratio.

4. A method for depositing a metal sulphide coating onto a substrate by a vacuum ion or plasma technique, comprising:

providing silicon and fluorine, or precursors thereof, into a deposition unit; and depositing a metal sulphide in the presence of silicon and fluorine onto the substrate to form a metal sulphide coating comprising a metal sulphide, silicon, and fluorine.

5. A product coated with a metal sulphide coating composition as claimed in claim 1.

6. A product coated with a metal sulphide coating composition as claimed in claim 2.

7. The method of claim 4 further comprising:

introducing at least one Noble gas or at least one reactive gas in the deposition unit during deposition.

8. The method of claim 4 wherein deposition occurs in an ultra-high vacuum.

9. The composition of claim 1 wherein said composition is homogeneous from its surface towards an interface with a substrate.

10. The composition of claim 1 wherein said composition is non-homogeneous in its structure from its surface towards an interface with a substrate.

11. The composition of claim 1 wherein said composition varies in composition from its surface towards an interface with a substrate.

12. The composition of claim 1 comprising a plurality of layers comprising different compositions.

13. The composition of claim 1 comprising a plurality of layers comprising different structures.

14. The composition of claim 1 wherein said composition is characterized by a low friction coefficient.

15. The composition of claim 1 wherein said composition is characterized by non-sticky properties.

16. A product coated with a metal sulphide coating composition as in claim 3.

17. A product coated with a metal sulphide coating composition as claimed in claim 4.

18. A product comprising a metal sulphide composition coating as claimed in claim 9.

19. A product comprising a metal sulphide composition coating as claimed in claim 10.

20. A product comprising a metal sulphide composition coating as claimed in claim 11.

21. A product comprising a metal sulphide composition coating as claimed in claim 12.

22. A product comprising a metal sulphide composition coating as claimed in claim 13.

23. A product comprising a metal sulphide composition coating as claimed in claim 14.

24. A product comprising a metal sulphide composition coating as claimed in claim 15.

25. The metal sulphide coating composition according to claim 3 wherein y is 0.01 to 4.

* * * * *